United States Patent [19]
Dingwall

[11] Patent Number: 4,602,241
[45] Date of Patent: Jul. 22, 1986

[54] INPUT CURRENT SAVING APPARATUS FOR FLASH A/D CONVERTER

[75] Inventor: Andrew G. F. Dingwall, Bridgewater, N.J.

[73] Assignee: RCA Corporation, Princeton, N.J.

[21] Appl. No.: 749,858

[22] Filed: Jun. 28, 1985

[51] Int. Cl.[4] .......................................... H03M 00/00
[52] U.S. Cl. ............................................ 340/347 AD
[58] Field of Search ................ 340/347 AD, 347 CC; 358/13

[56] References Cited

U.S. PATENT DOCUMENTS 4,400,693 8/1983 Flamm .......................... 340/347 AD
4,417,233 11/1983 Inoue ........................... 340/347 AD
4,507,649 3/1985 Dingwall ...................... 340/347 AD

FOREIGN PATENT DOCUMENTS 2082410A 3/1986 United Kingdom .

OTHER PUBLICATIONS

RCA Linear IC, CA 3300, CMOS Video Speed 6-Bit, Flash Analog-to-Digital Converter.

Primary Examiner—Charles D. Miller
Attorney, Agent, or Firm—Paul J. Rasmussen; Eric P. Herrmann; Dilip A. Kulkarni

[57] ABSTRACT

A flash analog-to-digital (A/D) converter includes a plurality of comparators, each of which is arranged to be alternately coupled with the input signal and the respective one of a plurality of reference voltages in order to find the closest match therebetween. The output of the comparators is fed to a programmable logic array (PLA) for determining a binary number related to the particular value of the input signal. Pursuant to this invention, the input signal is continuously tracked, and in dependence upon whether the input signal is above or below the midpoint reference potential, a predetermined potential, instead of the input signal, is applied to particular groups of comparators.

7 Claims, 3 Drawing Figures

INPUT CURRENT SAVING APPARATUS FOR FLASH A/D CONVERTER

This invention relates to flash analog-to-digital (A/D) converters, and in particular to an arrangement for reducing the current load on the reference potential ladder and the input signal source in the A/D converters.

BACKGROUND

The flash type A/D converter simultaneously compares an analog input signal with a plurality of ascending reference potentials to determine the closest match between the two. For example, a 7-bit A/D converter with the overflow bit uses 128 (i.e., $2^7$) comparators for performing the simultaneous comparisons. In A/D converters of the type exemplified by the IC, CA3300, from RCA, each comparator is alternately coupled to a respective one of the aforesaid plurality of reference potentials and the analog input signal through a coupling capacitor. The output of all the comparators connected to the reference potentials having a value less than the input signal exhibit one output state and the remaining comparators exhibit an opposite output state.

The outputs of the comparators are fed to logic circuitry (e.g., PLA), which produces a parallel, 7-bit binary code related to the magnitude of the analog input signal.

During each cycle, various capacitors (e.g., coupling capacitors and the gate and parasitic capacitances of the switching transistors) are discharged and recharged between the respective reference potentials and the input signal. When the input signal is at either extreme of the range of the reference potential levels, maximum current drain is produced on the reference potential ladder and the input signal source. On the other hand, when the input signal is at the midpoint of the reference potential levels, the current drain on the reference ladder and the input signal source is minimized since the various capacitors tend to be charged equally in the opposite directions during each cycle.

It is desirable to reduce the current drain on the reference ladder and the input signal source, since it introduces nonlinearities, and further reduces either the cycle rate of the A/D converter or decreases the accuracy of the converter for a fixed cycle rate.

U.S. Pat. No. 4,507,649, issued to Dingwall, et al., discloses one approach to the above-mentioned problem of heavy current drain. In the Dingwall et al. approach a field effect transistor (i.e., FET) is connected in series between each of the plurality of coupling capacitors and the input signal bus. The gate electrodes of the FET's are biased at D.C. potentials which are tailored to the relative position of the respective FET's along the reference ladder. The FET's are constrained to operate in the source follower mode with the various capacitors as the respective load elements for certain ranges of the input signal, so that the individual coupling capacitors cannot charge or discharge to a potential exceeding the respective FET's D.C. gate potential minus its threshold potential, and thereby reducing the loading on the reference ladder.

This invention discloses yet another concept for reducing the current drain on the reference ladder. In accordance with the present invention, the input signal is continuously made available to an intermediate group of comparators (e.g., middle 50%). In addition, the input signal is tested to determine if it is above or below the midpoint of the reference potential levels. If the input signal is above the midpoint, the lower group of comparators (e.g., lower 25%) receive a fixed lower voltage (e.g., 0.25 $V_{REF}$), instead of the input signal, in order to preclude the various capacitors (i.e., coupling, gate and parasitic) in the lower group of comparators from fully charging to the relatively high input signal level during each cycle. On the other hand, if the input signal is below the midpoint, the upper group of comparators (e.g., upper 25%) are provided with a fixed higher voltage (e.g., 0.75 $V_{REF}$), in lieu of the input signal, thereby preventing the various capacitors associated with the upper group of comparators from fully discharging to the relatively low input signal level during each cycle.

IN THE DRAWINGS

DETAILED DESCRIPTION

Figure 1:
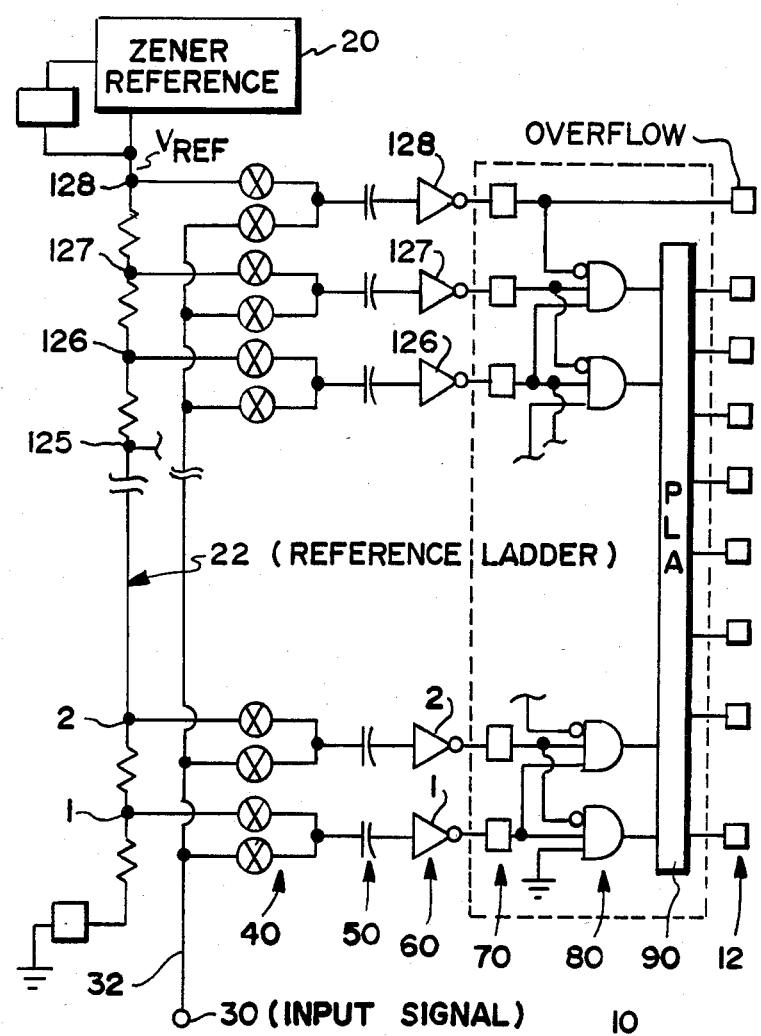
FIG. 1 is a block diagram of a known 7-bit flash analog-to-digital converter.

Referring to FIG. 1, a representative flash A/D converter 10 is shown, which is capable of producing a parallel seven bit output signal 12. The A/D converter 10 is generally of the type disclosed in the afore-mentioned U.S. Pat. No. 4,507,649, issued to Dingwall, et al. The seven bit output signal corresponds to the division of the maximum permitted input signal (i.e., $V_{REF}$) into 128 (or $2^7$) equally-spaced, ascending values. This is accomplished by applying a known voltage $V_{REF}$, from a source 20, across a linear resistor ladder 22, and tapping the potential across the resistor 22 at 128 equispaced intervals. Each of the 128 taps provides increasing reference voltages.

The analog input signal is made available on the input bus 32 connected to an input signal source 30. A plurality of switches 40 alternately apply the input signal and the respective reference voltages to the comparators 60 through the associated coupling capacitors 50 during each cycle. The outputs of all the comparators 60 connected to the reference voltages having values less than the input voltage experience one output state (e.g., logical high), and the remaining comparators exhibit a second output state (e.g., logical low).

The comparators 60 are clocked to sample and compare the input signal at prescribed intervals. At the end of the sampling period, the output states of the comparators 60 are stored in the respective latches 70.

The outputs of the latches 70 are applied to the respective 3-input AND gates 80. Each of the AND gates 80 examines triplets of successive ascending comparator states during every cycle. The AND gates 80 generate a logical high output signal only for the condition that two adjacent latches connected to a particular AND gate are exhibiting a logical "high" output state and the next ascending latch is exhibiting a logical "low" output state. This arrangement of the AND gates senses the transition point in the output states of the comparators 60, and produces only a single logical "high" output state for a given input signal.

The outputs of the AND gates 80 are fed to a programmable logic array (or PLA) 90, which generates a parallel 7-bit output signal 12 corresponding to the particular AND gate currently exhibiting a logical "high" output state.

Figure 2:
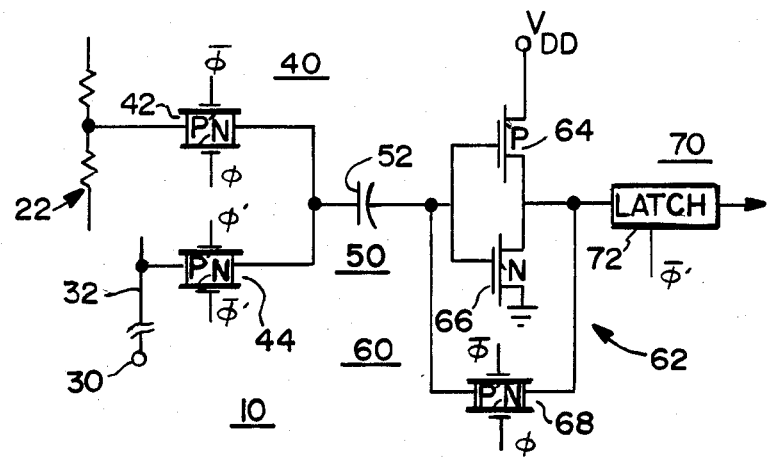
FIG. 2 illustrates certain details of the A/D converter of FIG. 1.

FIG. 2 depicts certain details of the FIG. 1 A/D converter 10. A pair of complementary transistor switches 42 and 44 serve to alternately couple the reference potential and the input potential to a comparator 62 through a coupling capacitor 52 during each cycle.

The comparator 62 is in the form of a self-biased CMOS inverter comprising a P-type and N-type field effect transistor (FET's) 64 and 66 respectively. The FET's 64 and 66 have their respective conduction paths connected together in series between a source of positive potential ($V_{DD}$) and the ground potential. The gate electrodes of the FET's 64 and 66 are joined together to provide a common input terminal. The output signal of the FET's 64 and 66 is derived from the common junction of the respective conductive paths. A complementary transistor switch 68, comprising a P-type and a N-type MOS device, selectively connects the inverter output terminal to the inverter input terminal in response to a pair of complementary control signals $\phi$ and $\bar{\phi}$. This biases the inverter 62 at its switch or midpoint, with the bias potential being stored on the coupling capacitor 52.

During an equilibration period, the inverter output potential is fed back to one of the plates of the coupling capacitor 52. A second complementary switch 42, responsive to the same control signals $\phi$ and $\bar{\phi}$, couples the reference potential to the other plate of the coupling capacitor 52. The switches 42 and 68 then turn off, thereby leaving the inverter 62 biased at it operating potential (i.e., $V_{DD}/2$) and also leaving the coupling capacitor 52 charged to the level of the difference between the reference potential and the inverter operating potential.

After the switches 42 and 68 are opened, a third complementary transistor switch 44 connects the input voltage to the coupling capacitor 52 in response to a second pair of complementary control signals $\phi'$ and $\bar{\phi}$. The timings of these first and second control signals are such that the switches 42 and 68 are opened prior to the closing of the switch 44. The difference between the input voltage and the reference voltage is coupled across the capacitor 52 to the inverter 62. If the reference voltage applied to the inverter 62 is less than the input voltage, it exhibits a "high" logical output state, and vice versa. The output of the inverter 62 is stored in the latch 72 as the control signal $\phi'$ goes low.

During each sampling interval, the various capacitors (i.e., coupling capacitors and the gate and parasitic capacitances of the switching transistors) are alternately charged and discharged between the respective reference voltages and the input voltage. If the input voltage coupled to the capacitors during one sampling interval is at the high end of the range of reference potentials (i.e., $V_{REF}$), then during the next sampling interval, substantially all the capacitors will be discharged to reference potentials lower then the input voltage and then recharged back to the input voltage near the maximum reference potential $V_{REF}$. This produces a heavy current drain on the reference potential source 20 and the input signal source 30. It is noted that most of the current drain is wastefully produced at the reference potential taps on the ladder 22, which are furthest from the tap which matches the input potential. On the other hand, very little current drain results at the reference potential taps near the tap with the reference potential matching the input potential. Heavy current drain also occurs when the input voltage is near the ground potential for similar reasons. On the other hand, when the input voltage is near the midpoint of the reference potential levels, only moderate current drain is imposed on the reference potential ladder 22 and the input signal source 30.

Figure 3:
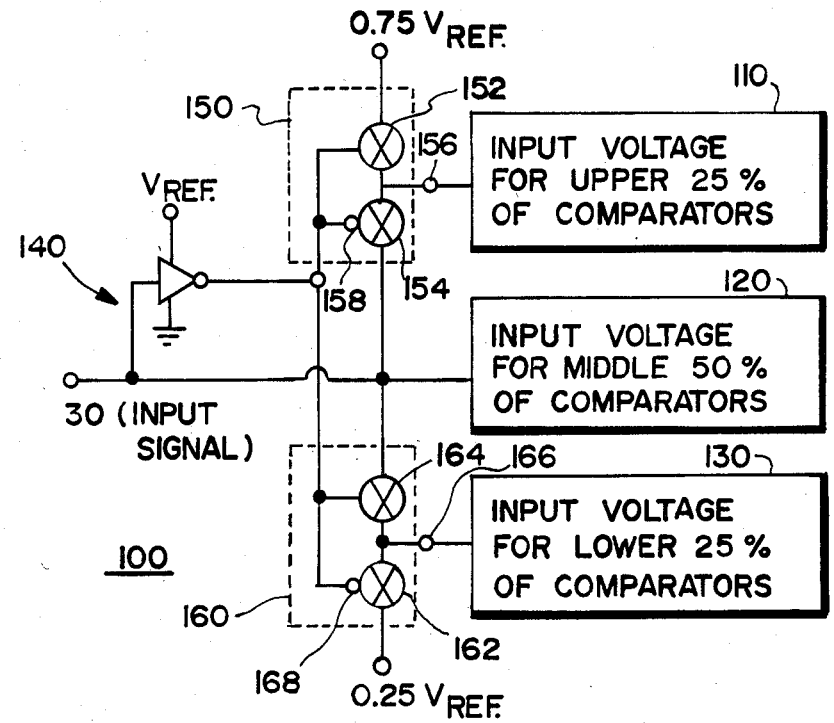
FIG. 3 shows a modification to the FIG. 1 A/D converter in accordance with the subject invention.

Pursuant to the present invention, the A/D converter 10 is modified as shown in FIG. 3 to substantially reduce the current drain on the reference ladder 22 and the input signal source 30 by not applying input signals to those comparators 60 which are well removed from the reference tap matching the input potential. The comparators 60 are illustratively grouped in 3 groups in correspondence with the ranges of reference potentials to which they are connected. In this particular embodiment, the upper, middle and lower groups of comparators 110, 120 and 130 are respectively coupled to the top 25%, the middle 50%, and the bottom 25% of the reference potential taps. The input signal is selectively made available to the upper and lower groups of comparators 110 and 130 in the manner described hereinbelow. In contrast, the input signal is continuously made available to the middle group of comparators 120. It will be noted that the choice of three groups of comparators in the particular embodiment described herein is arbitrary.

The modification 100, in accordance with the instant invention, includes means 140, which tests the input signal and develops a control signal depending upon the input signal being above or below the midpoint of the reference potentials. The midpoint sensing means 140 is a threshold detector which develops a logical "low" control potential when the input signal is greater than $V_{REF}/2$ and a logical "high" control potential when the input signal is less than $V_{REF}/2$. The control signal on the output terminal 142 of the midpoint sensing means 140 is fed to first and second switching means 150 and 160 for selectively applying either the input potential or an appropriate fixed potential (e.g., 0.75 $V_{REF}$ and 0.25 $V_{REF}$) to the upper and lower groups of comparators 110 and 130.

The first switching means 150 comprises first and second transistor switches 152 and 154 (e.g., FET's). The first transistor switch 152 has its conduction path connected in series between a relatively high fixed voltage (e.g., 0.75 $V_{REF}$) and the signal input terminal 156 of the upper group of comparators 110. The control signal on the terminal 142 is applied to the control electrode of the first transistor switch 152. The second transistor switch 154 has its conduction path coupled in series between the input signal source 30 and the input terminal 156 of the upper group of comparators 110. The control signal on the terminal 142 is applied to the control electrode of the second transistor switch 154 through an inverter 158. The transistor switches 152 and 154 are arranged to operate in a complementary fashion. When the input signal is above the midpoint reference potential, the control signal on the terminal 142 serves to open the first transistor switch 152, and to close the second transistor switch 154 to couple the input signal from the source 30 to the input terminal 156 of the upper group of comparators. Alternatively, when the input signal is below the midpoint reference potential, the first transistor switch 152 connects the relatively high fixed voltage (0.75 $V_{REF}$) to the input terminal 156 of the upper group of comparators 110 and the second transistor switch 154 blocks off the input signal from the source 30 from being applied to the upper group. In other words, this arrangement precludes all the capacitors (i.e., coupling, gate and parasitic) associated with the upper group of comparators 110 from discharging to the relatively low input signal level when the input signal is below the midpoint reference potential, whereby unnecessary heavy current drain on the reference ladder 22 and the input signal source 30 is avoided.

Similarly, the second switching means 160, consists of third and fourth transistor switches 162 and 164 (i.e., FET's), which serve to selectively couple the input signal source 30 to the input terminal 166 of the lower group of comparators 130 when the input signal is below the midpoint reference potential. When the input signal is above the midpoint reference potential, the third transistor switch 162 is turned on to feed the relatively low fixed voltage (0.25 $V_{REF}$) to the input terminal 166 of the lower group of comparators 130, and the fourth transistor switch 164 is switched off to isolate the input signal source 30 from the lower group. Thus, the second switching means 160 prevents all the capacitors (i.e., coupling, gate and parasitic) associated with the lower group of comparators 130 from charging to the relatively high input signal level when the input signal is above the midpoint reference potential, thereby again reducing the current drain on the reference ladder 22 and the input signal source 30.

Thus, in accordance with this invention, the input signal is continuously monitored, and depending upon whether the input signal is above or below the midpoint reference potential, a fixed potential, in lieu of the input signal, is supplied to the remotest comparators which drain heavy input current. This strategy can typically reduce the input current drain to about 25 to 30% range. As long as the input voltage monitoring can be made sufficiently fast, the net result will be to substantially reduce the current drain on the reference ladder without sacrificing accuracy of the analog-to-digital conversion process.

Although, in the particular embodiment described herein, the comparators are divided into three groups, it will be appreciated that the comparators may be divided into two or more groups, and the current drain on the reference voltage ladder and the input signal source can be reduced by disabling the input signals to the comparators that are well removed from the tap with a reference potential matching the input signal.

What is claimed is:

1. In a flash analog-to-digital converter including a first source of an input signal and a second source of a plurality of incrementally ascending reference voltages; said converter further having first and second group of comparators, each of which is arranged to be alternately coupled with said input signal and a respective one of said reference voltages; said first and second group of said comparators being respectively coupled to the upper 50% and lower 50% of reference voltages; an improvement for limiting the loading on said sources of input signal and reference voltages comprising:
   sensing means for determining whether said input signal is above or below the midpoint of said plurality of reference voltages; and
   switching means coupled to said midpoint sensing means for selectively applying said input signal to one of said first and second group of comparators and an appropriate fixed voltage to the other of said first and second group of comparators.

2. In a flash analog-to-digital converter including a first source of an input signal and a second source of a plurality of incrementally ascending reference voltages; said converter further having a plurality of comparators, each of which is arranged to be alternately coupled with said input signal and a respective one of said reference voltages; an improvement for limiting the loading on said sources of input signal and reference voltages comprising:
   means for continuously applying said input signal to an intermediate group of comparators disposed between an upper and lower groups of comparators; said upper, lower and intermediate groups of comparators being respectively operative in the relatively high, low and intermediate ranges of reference voltages;
   means for sensing whether said input signal is near the high or the low end of said plurality of reference voltages; and
   switching means responsive to the output of said sensing means for selectively applying said input signal to one of said upper and lower group of comparators and an appropriate fixed voltage to the other of said upper and lower group of comparators.

3. In a flash analog-to-digital converter including a first source of input signal and a second source of a plurality of incrementally ascending reference voltages; said converter further having a plurality of comparators, each of which is arranged to be alternately coupled with said input signal and a respective one of said reference voltages; an improvement for limiting the loading on said sources of input signal and reference voltages comprising:
   means for applying said input signal directly to an intermediate group of comparators disposed between a first and a second group of comparators; said first, second and intermediate group of comparators being respectively operative in the relatively high, low and middle ranges of reference voltages;
   means for sensing whether said input signal is above or below the midpoint of said plurality of reference voltages; and
   switching means coupled to said midpoint sensing means for selectively applying said input signal to one of said first and second group of comparators and an appropriate fixed voltage to the other of said first and second group of comparators.

4. The analog-to-digital converter of claim 1 wherein said midpoint sensing means is a threshold detector.

5. The analog-to-digital converter set forth in claim 1 wherein said switching means comprises:
   a first gating means responsive to said output of said midpoint sensing means for coupling either said input signal or a first predetermined voltage to said first group of comparators operative in said relatively high range of reference voltages depending upon whether said input signal is above or below said midpoint reference voltage respectively; and
   a second gating means responsive to said output of said midpoint sensing means for coupling either said input signal or a second predetermined voltage to said second group of comparators operative in said relatively low range of reference voltages depending upon whether said input signal is respectively below or above said midpoint reference voltage.

6. The analog-to-digital converter set forth in claim 3 wherein each of said first and second gating means comprises a pair of complementary transistor switches connected in series between (a) the respective one of said first and second groups of comparators, and (b) said input signal and the appropriate one of said first and second predetermined voltages respectively; said complementary transistor switches further having their respective control electrodes coupled to said output of said midpoint sensing means.

7. The analog-to-digital converter set forth in claim 4 wherein said first, second and intermediate groups of comparators are respectively coupled to the upper 25%, lower 25% and middle 50% of said plurality of said reference voltages; wherein said first and second predetermined voltages are respectively at the 75% and 25% points along said plurality of ascending reference voltages.

* * * * *

UNITED STATES PATENT AND TRADEMARK OFFICE
CERTIFICATE OF CORRECTION

PATENT NO. : 4,602,241
DATED : July 22, 1986
INVENTOR(S) : Andrew Gordon Francis Dingwall It is certified that error appears in the above-identified patent and that said Letters Patent is hereby corrected as shown below:

Column 3, line 21, that portion reading "$\phi$" should read -- $\bar{\phi}$ --.

Column 3, line 28, that portion reading "$\phi$" (first occurrence) should read -- $\bar{\phi}$ --.

Column 3, line 39, that portion reading "$\phi$" should read -- $\bar{\phi}$ --.

Column 3, line 48, that portion reading "$\phi'$" should read -- $\bar{\phi}'$ --

Signed and Sealed this

Thirtieth Day of December, 1986

*Attest:*

DONALD J. QUIGG

*Attesting Officer*     *Commissioner of Patents and Trademarks*